United States Patent [19]

Engelsberg

[11] Patent Number: 5,099,557
[45] Date of Patent: Mar. 31, 1992

[54] REMOVAL OF SURFACE CONTAMINANTS BY IRRADIATION FROM A HIGH-ENERGY SOURCE

[76] Inventor: Audrey C. Engelsberg, 23 Elmer Pl., Milton, Vt. 05468

[21] Appl. No.: 611,198

[22] Filed: Nov. 9, 1990

Related U.S. Application Data

[62] Division of Ser. No. 216,903, Jul. 8, 1988, Pat. No. 5,024,968.

[51] Int. Cl.$^5$ .......................................... H01L 21/268
[52] U.S. Cl. .............................. 29/25.01; 250/492.1; 250/492.2; 250/492.3
[58] Field of Search ............. 250/492.1, 492.2, 492.23; 29/25.01

[56] References Cited

U.S. PATENT DOCUMENTS

| | | |
|---|---|---|
| 3,364,087 | 4/1964 | Solomon et al. |
| 3,464,534 | 9/1969 | Muncheryan. |
| 3,503,804 | 3/1970 | Schneider. |
| 4,160,166 | 7/1979 | Etienne .......................... 250/429.1 |
| 4,181,538 | 1/1980 | Narayan et al. |
| 4,292,093 | 9/1981 | Ownby et al. |
| 4,305,973 | 12/1981 | Yaron et al. |
| 4,393,311 | 7/1983 | Feldman ............................ 250/310 |
| 4,568,632 | 2/1986 | Blum ................................ 250/492.1 |
| 4,668,304 | 5/1987 | Schachameyer et al. |
| 4,680,616 | 7/1987 | Delahoy et al. |
| 4,687,539 | 8/1987 | Burns ................................... 156/345 |
| 4,731,516 | 3/1988 | Noguchi et al. |
| 4,782,029 | 11/1988 | Takemura et al. |

FOREIGN PATENT DOCUMENTS

| | | |
|---|---|---|
| 0268301 | 5/1988 | European Pat. Off. ......... 250/429.1 |
| 57-102229 | 12/1980 | Japan. |
| 56-7439 | 1/1981 | Japan. |
| 56-23748 | 6/1981 | Japan. |
| 57-76846 | 5/1982 | Japan. |
| 57-187936 | 11/1982 | Japan. |
| 59-215728 | 12/1984 | Japan. |
| 60-37736 | 2/1985 | Japan. |

OTHER PUBLICATIONS

Zehner et al., Preparation of Atomically Clean Silicon Surfaces by Pulsed Laser Irradiation, 1-1-80.
McKinley et al., Atomically Clean Semiconductor Surfaces Prepared by Laser Irradiation, 1980.
Bermudez, Changes in Surface Composition of Si, TiO$_2$, SiO$_2$ Induced by Pulsed Ruby-Laser Irradiation, 1-82.
Jellison et al., Time-Resolved Ellipsometry, 9-1-85.
Bedair et al., Atomically Clean Surfaces by Pulsed Laser Bombardment, 1969.
Lazzarini et al., Lasers for the Cleaning of Statuary: Initial Results and Potentialities, 1973.
Zehner et al., Surface Studies of Laser Annealed Semiconductors, 1983.
Zehner et al., Silicon Surface Structure and Surface Impurities after Pulsed Laser Annealing, 1980.

*Primary Examiner*—Olik Chaudhuri
*Assistant Examiner*—Ourmazd S. Ojan
*Attorney, Agent, or Firm*—Howrey & Simon

[57] ABSTRACT

A method and apparatus for removing surface contaminants from the surface of a substrate by high-energy irradiation is provided. The invention enables removal of surface contaminants without altering of the substrate's underlying molecular structure. The source of high-energy irradiation may comprise a pulsed laser.

10 Claims, 2 Drawing Sheets

REMOVAL OF SURFACE CONTAMINANTS BY IRRADIATION FROM A HIGH-ENERGY SOURCE

This is a divisional of copending application Ser. No. 07/216,903 filed on July 8, 1988, now U.S. Pat. No. 5,024,968.

BACKGROUND OF THE INVENTION

This invention relates to a method and apparatus for removing contaminants from a surface. More particularly, the invention relates to the removal of contaminants from a substrate surface through the application of energy from a high-energy source while the molecular crystal structure of the surface being treated is preserved.

Surface contaminants include discrete pieces of matter that range in size from submicrons to granules visible to observation with the eye. Such contaminants may be fine dust or dirt particles or unwanted molecules comprised of elements such as carbon or oxygen. Contaminants frequently become adhered to a surface by weak covalent bonds, electrostatic forces, van der Waals forces, hydrogen bonding, coulombic forces or dipole-dipole interactions, making removal of the contaminants difficult.

In certain instances, the presence of surface contaminants renders the contaminated substrate less efficient or inoperable for the substrate's designated purpose. For example, in certain precise scientific measurement devices, accuracy is lost when optical lenses or mirrors in the devices become coated with microfine surface contaminants. Similarly in semiconductors, surface defects due to minor molecular contaminants often render semiconductor masks or chips worthless. Reducing the number of molecular surface defects in a quartz semiconductor mask by even a small amount can radically improve semiconductor chip production yields. Similarly, removing molecular surface contaminants, such as carbon or oxygen, from the surface of silicon wafers before circuit layers are deposited on the wafer or between deposition of layers significantly improves the quality of the computer chip produced.

The need for clean surfaces free of even the finest contaminants has led to the development of a variety of currently used surface cleaning methods. These known methods, however, each have their own serious drawbacks. For example, widely used chemical and mechanical cleaning techniques require the use of cleaning tools and agents that can introduce as many new contaminants to a treatment surface as they remove.

Another currently used method for cleaning substrate surfaces without outside agents requires that the treatment surface be melted to release contaminants which are then removed by ultra high vacuum pressure. This method has the disadvantage that the surface being treated must be briefly melted which may be undesirable, as for example when a semiconductor surface is cleaned between deposition of circuit layers and it is desired that the integrity of the previously deposited layers not be disturbed. A further disadvantage with this process is that ultra high vacuum equipment is both expensive and time consuming to operate.

Annealing treatment methods suffer similar drawbacks. When a surface is cleaned by annealing methods, the treatment surface of the substrate being cleaned is heated to a temperature that is generally below the melting point of the material being treated but high enough to enable rearrangement of the material's molecular crystal structure. The surface being treated is held at this elevated temperature for an extended period during which time the surface molecular crystal structure is rearranged and contaminants are removed by ultra high vacuum. Annealing cleaning methods cannot be used where it is desired to preserve the integrity of the existing structure being cleaned.

Another currently utilized cleaning method, known as ablation, suffers from its own particular drawbacks. With ablation, a surface or contaminants on a surface are heated to the point of vaporization. Depending on the material being ablated, the material may melt before being vaporized or the material may sublimate directly on heating. With ablation cleaning techniques, if damage to the treatment surface is to be prevented, the ablation energy must be exactly aimed toward contaminants rather than the surface on which the contaminants lie, a difficult task when the contaminants are extremely small or randomly spaced. Even where the ablation energy can be successfully directed at a contaminant, it is difficult to vaporize the contaminant without also damaging the underlying treatment surface.

Surface cleaning by melting, annealing and ablation can be conducted with a laser energy source. However, using a laser energy source to remove contaminants from a surface by melting, annealing or ablation does not overcome the inherent disadvantages of these processes. For example, in U.S. Pat. No. 4,292,093, "Method Using Laser Irradiation For the Production of Atomically Clean Crystalline Silicon and Germanium Surfaces" the laser annealing method disclosed requires both vacuum conditions and energy levels sufficient to cause rearrangement and melting of the treatment surface. Other known laser surface cleaning methods involving melting or annealing require similar high energy lasing and/or vacuum conditions, as disclosed in U.S. Pat. Nos. 4,181,538 and 4,680,616. Similarly the laser ablation technique disclosed in U.S. Pat. No. 3,464,534, "Laser Eraser" suffers the same drawbacks as other high energy ablation methods.

Accordingly, it is an object of the invention to provide a method and apparatus for removing contaminants from a substrate surface that does not alter the molecular crystal structure of the surface being treated.

It is another object of the invention to provide a method and apparatus for removing contaminants from a treatment surface that does not melt or vaporize any portion of the surface being treated.

It is another object of the invention to provide a method and apparatus for removing contaminants from the surface of a substrate that introduces no additional impurities to the substrate surface.

It is a further object of the invention to provide a method and apparatus for cleaning a substrate surface that does not require a vacuum and can be conducted economically in a very short period of time.

Additional objects and advantages of the present invention will be set forth in part in the description that follows and in part will be obvious from the description or may be learned by practice of the invention. The objects and advantages of the invention may be realized and obtained by the method and apparatus particularly pointed out in the appended claims.

SUMMARY OF THE INVENTION

To achieve the objects and in accordance with the purpose of the invention, as embodied and as broadly described herein, a method and apparatus for removing surface contaminants from the surface of a substrate while preserving the molecular crystal structure of the surface being treated is provided. The method includes the step of constantly flowing a gas across the substrate treatment surface and the step of irradiating the substrate with irradiation from a high energy source, the irradiation characterized by an energy density and duration between that required to release surface contaminants from the substrate treatment surface and that required to alter the molecular crystal structure of the substrate treatment surface. Preferably, the irradiation from the high-energy source is pulsed laser irradiation. The method of the invention can be beneficially applied for removing surface contaminants from a semiconductor substrate before, between and after deposition of the circuitry layers on the semiconductor substrate.

The apparatus of the invention includes a gas inert to the substrate treatment surface, gas flow means for constantly flowing the gas across the treatment surface and a high-energy irradiation generating means for generating energy against the substrate treatment surface over which the gas passes. The high-energy irradiation generating means generates irradiation of an energy density and duration between that required to release surface contaminants from the substrate treatment surface and that required to alter the molecular crystal structure of the substrate treatment surface. Preferably the high energy irradiation generating means is a pulsed ultraviolet laser.

The accompanying drawings which are incorporated in and constitute a part of this specification, illustrate presently preferred embodiments of the invention and, together with the description, serve to explain the principles of the invention.

DESCRIPTION OF THE PREFERRED EMBODIMENT

Figure 1:
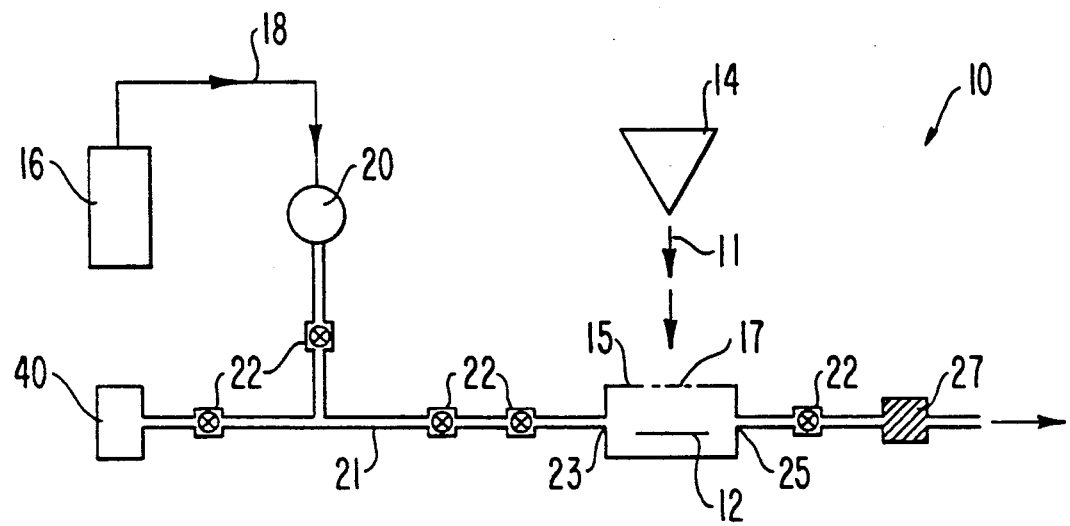
FIG. 1 is a schematic diagram of contaminant removal according to the invention.

Reference will now be made in detail to a presently preferred embodiment of the invention, an example of which is illustrated in the accompanying drawings. Throughout the drawings, like reference characters are used to designate like elements.

A method for removing surface contaminants from the surface of a substrate while preserving the molecular crystal structure of the surface being treated is illustrated in FIG. 1. As shown in FIG. 1, an assembly 10 holds a substrate 12 from which surface contaminants are to be removed. A gas 18 from gas source 16 is constantly flowed over substrate 12. Gas 18 is inert to substrate 12 and is flowed across substrate 12 so as to bathe substrate 12 in a non-reactive gas environment. Preferably, gas 18 is a chemically inert gas such as helium, nitrogen or argon. An enclosure 15 for holding substrate 12 communicates with gas source 16 through a series of tubes 21, valves 22, and a gas flow meter 20.

According to the embodiment of the invention shown in FIG. 1, enclosure 15 comprises a stainless steel sample reaction cell fitted with opposing gas inlet and outlet ports 23, 25 respectively. Enclosure 15 is fitted with a sealed optical grade quartz window 17 through which irradiation can pass. Inlet and outlet ports 23, 25 may comprise, for example, stainless steel tubing fitted with valves After sample 12 is placed in enclosure 15, enclosure 15 is repeatedly flushed and backfilled with gas 18 and is kept at a pressure slightly above ambient atmospheric pressure to prevent inflow of other gases. Although enclosure 15 is shown as a solid chamber, it is anticipated that a surface being cleaned could be enclosed in any type of enclosure through which a gas can be flowed. For example, if the surface being treated is a large fixed object, a large portable enclosure such as a plastic bag might be utilized.

Flow of gas 18 may be regulated by flow meter 20 which, in the preferred embodiment, is a Matheson Model 602 flow meter. Valves 22 are preferably metering, regulating or bellows valves suitable for high temperature and pressure applications and for use with toxic, hazardous, corrosive or expensive gases or liquids, as for example Swagelok SS-4H TM series valves by Swagelok Co. of Solon, Ohio. Valves 22 can be opened or closed to isolate enclosure 15, to communicate enclosure 15 with gas source 16 or to put enclosure 15 in communication with another substance, such as a gas for depositing on substrate 12, coming from an alternate source 40.

According to the method of the invention, the substrate treatment surface is irradiated with high-energy irradiation characterized by an energy density and duration between that required to release surface contaminants from the substrate treatment surface and that required to alter the molecular crystal structure of the substrate treatment surface. According to the preferred embodiment of the invention shown in FIG. 1, a laser 14 generates laser irradiation which is directed against the treatment surface of substrate 12. In FIG. 1, laser 14 is shown as being outside enclosure 15 and irradiating sample 12 through quartz window 17. However, it is contemplated that laser 14 could alternatively be placed within the enclosure 15.

The energy flux and the wavelength of the high-energy irradiation is preferably selected to be dependent upon the surface contaminants being removed. To this end, a gas analyzer 27 may be connected to outlet port 25. Analyzer 27 analyzes the contents of exhaust gas from enclosure 15 to facilitate selective energy and wavelength adjustment of laser 14. Gas analyzer 27 may be a mass spectrometer as for example a quadrapole mass spectrometer manufactured by Bruker Instruments, Inc. of Billerica, Mass. or by Perkin Elmer of Eden Prairie, Minn.

Selection of the high-energy irradiation source for use in the invention depends upon the desired irradiation energy and wavelength. The electron volt/photon (eV/photon) of the irradiation is preferably at least twice the energy necessary to break the bonds adhering the contaminants to the surface being cleaned The bond energies between common contaminants such as carbon and oxygen, and common substrate materials such as silicon, titanium, germanium, iron, platinum and aluminum range between 2 and 7 eV/bond as disclosed in Handbook of Chemistry and Physics, 68th ed., pp. F-169 to F-177 (CRC Press 1987) which is hereby incorporated by reference. Accordingly, lasers emitting photons with energies in the range of 4 to 14 eV/photons are desirable. The wavelength should be below the wavelength that would compromise the integrity of the substrate surface by the photoelectric effect, as described in G. W. Castellan, Physical Chemistry, 2d ed., 458-459 (Academic Press, 1975) which is hereby incorporated by reference. The preferred wavelength depends on the molecular species being removed and the resonance states of such species. The wavelengths and photon energies of a number of lasers operable in the invention are listed below.

TABLE I

| Laser | Wavelength (nm) | eV/photon |
| --- | --- | --- |
| XeCl, pulsed | 308 | 4.04 |
| argon-ion, continuous wave | 257 | 4.83 |
| KrF, pulsed | 248 | 5.01 |
| ArF, pulsed | 193 | 6.44 |
| Tunable dye lasers, pulsed or continuous wave | 200-800 | 1.55-6.22 |

These lasers are described in greater detail in the following references which are hereby incorporated by reference: M. J. Webber, ed., *CRC Handbook of Laser Science*, Vols. 1-5 (1982-1987); Mitsuo Maeda, Laser Dyes, (Academic Press 1984); and laser product literature from Lambda Physik at 289 Great Road, Acton, Mass., Coherent, Inc. at 3210 Porter Drive, Palo Alto, Calif., and Spectra-Physics at 1250 West Middlefield Road, Mountain View, Calif. It is anticipated that high-energy xeon or mercury lamps or other types of lasers, including visible, ultraviolet, infared, x-ray or free electron lasers might be utilized as the irradiation source in the invention.

According to the invention, the irradiation directed against the substrate treatment surface has a power density less than that required to alter the molecular crystal structure of the treatment surface from which contaminants are being removed. Preferably, the power density of the irradiation and the duration of the irradiation are selected so as to impart an amount of energy on the substrate surface that is significantly below the energy required for alteration of the substrate surface structure. The preferred energy level is dependent on the composition of the substrate being treated. For example, with certain substrate materials such as plastics, this energy level would be much lower than for other materials such as high strength carbide steels. The heats of formation for various materials are well known and are reported in the *Handbook of Chemistry and Physics*, 68th ed., pp. D33-D42 (CRC Press 1987), which is hereby incorporated by reference. The heat of formation generally corresponds to the amount of heat required to break down various materials and can be used as a guideline in selecting a laser irradiation energy level and duration that will not alter the molecular structure of the surface being treated. The heats of formation of a number of common substrate materials are summarized in the following table.

TABLE II

| Material | Heat of Formation | |
| --- | --- | --- |
| $Al_2O_3$ | 16906.7 kgJ/mol; | 17.52 eV/molecule |
| $SiO_2$ | 840.3 kgJ/mol; | 9.11 eV/molecule |
| $Nb_2O_5$ | 1528.2 kgJ/mol; | 13.27 eV/molecule |
| NiO | 230.6 kgJ/mol; | 2.50 eV/molecule |
| $Ti_2O_3$ | 500.2 kgJ/mol; | 15.63 eV/molecule |

The irradiation energy density and duration of irradiation used in the present invention is such that the heat of formation is not approached on the substrate treatment surface Finding the maximum energy usable on a given substrate material will require some experimentation in light of the material's known heat of formation. Thus, annealing, ablation and melting are prevented from occurring.

When a substrate surface is irradiated as described above, the bonds and/or forces holding surface contaminants to the substrate surface are broken and the inert carrier gas carries contaminants away from the substrate surface during laser irradiation. As long as the cleaned substrate remains in the inert gas environment, new contaminants will not form on the substrate surface If necessary, a suitable trapping system may be connected to enclosure outlet 25 for trapping and neutralizing removed contaminant species.

Figure 2:
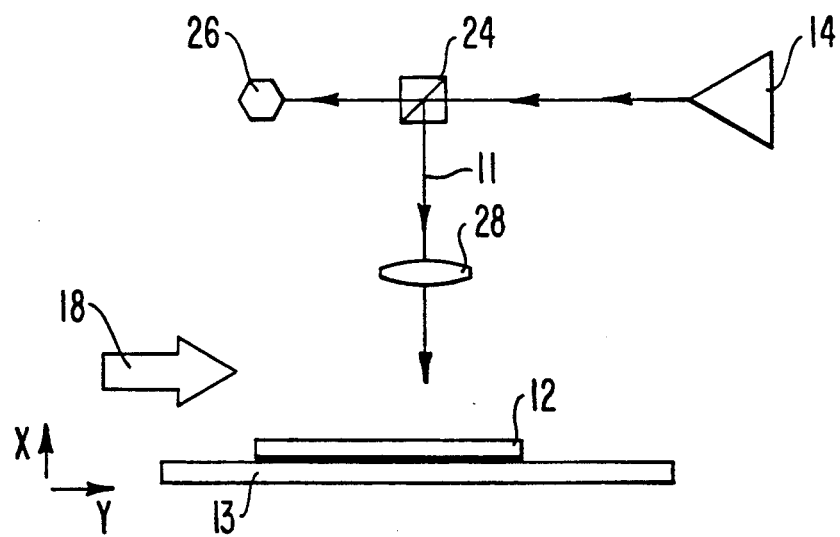
FIG. 2 is a schematic diagram showing how laser irradiation is directed in one embodiment of the invention.
Figure 3:
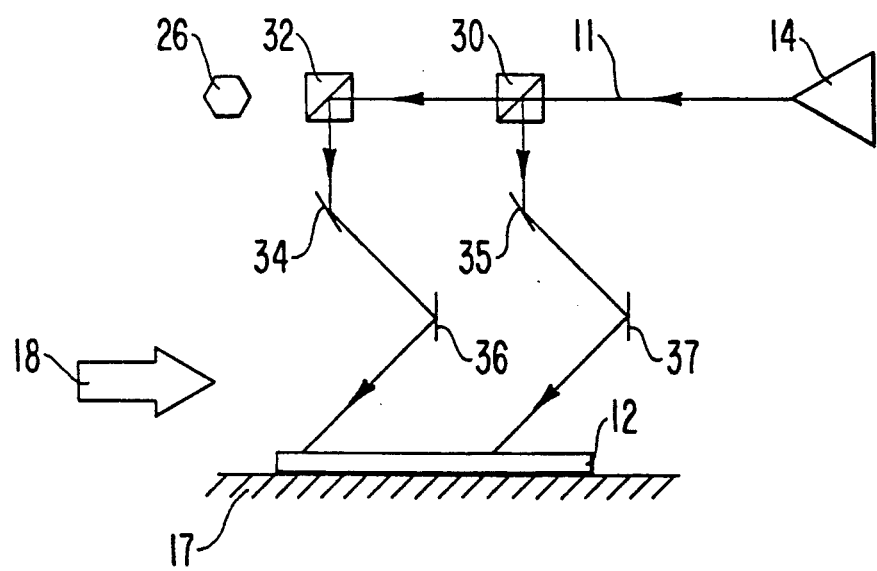
FIG. 3 is a schematic diagram showing how laser irradiation is directed in another embodiment of the invention.

A substrate being treated may be selectively exposed to the laser irradiation by a variety of methods. As shown in FIG. 2, for example, substrate 12 is fixed on an XY table 13 which is selectively moved with respect to a fixed beam of laser pulses 11 that are directed through a beam splitter 24 and a focusing lens 28 before contacting selected portions of the surface of substrate 12 over which inert gas 18 flows. Alternatively, as shown in FIG. 3, laser pulses 11 may be split by beam splitters 30, 32 into two sets of pulses which are selectively moved by adjusting mirrors 34-37 over the surface of substrate 12 on a fixed table 17. A laser power meter 26 allows for close monitoring of the laser power being applied to the substrate.

EXAMPLE I

The native oxide of silicon is necessary for the promotion of thin film growth on semiconductor surfaces. Unfortunately, when semiconductor surfaces of silicon oxide are exposed to the environment, carbon contaminants adhere weakly to the semiconductor surface. The presence of these contaminants greatly reduces the conductivity or the insulating nature of the thin film to be deposited Therefore, in semiconductor production, great precautions are taken to minimize environmental exposure through the use of elaborate vacuum, chemical and mechanical techniques. Vacuum techniques are expensive especially if high or near ultra high vacuum is used to keep surfaces clean between processing steps. Chemical (wet & dry) and mechanical techniques can damage the substrate treatment surface and, if the substrate being treated is a processed integrated circuit, damage to the underlying structure may occur.

In an attempt to overcome these problems, a pulsed KrF excimer laser whose fundamental wavelength is 248 nm (UV range) was directed at the surface of a silicon substrate in a sealed box through which argon gas was flowed. In order to decrease surface carbon contamination and decrease carbon percentage with chemisorbed organometallic (trimethyl aluminum), a precursor to aluminum thin film formation in semiconductor production, irradiation of 35 mJ/$cm^2$ for 6000 laser shots at a 10 Hz repetition rate was applied to a silicon oxide substrate surface with the KrF excimer laser The laser treated surfaces were exposed during a continuous flow of argon gas at a flow rate of 16 l/hr under a 1.03 × 103 torr backing regulator pressure After treatment, XPS analysis showed the substrate exhibited a significant decrease in surface carbon from a pretreatment average surface carbon covering 30-45% of the substrate surface to an after treatment average surface carbon covering 19% of the substrate surface. The substrate surface itself showed no damage or alteration.

A surface treated with laser irradiation as described above and then exposed to an organometallic gas flow showed, by XPS analysis, that 20.8% of the substrate surface was covered with carbon as compared to 40–45% of the substrate surface that was covered with carbon after organometallic gas exposure on a non-laser treated surface. When the laser was applied, as described above, both prior to exposure to organometallic gas and again after gas exposure, only 8.9% of the surface was covered with carbon Areas adjacent to the laser-exposed areas also exhibited some effects of the laser-cleaning treatment. Areas adjacent to the treated area showed a reduced carbon level of 12.7 percent. This effect probably is due to the gaussian nature of the applied laser pulse.

Transfer of the wafer from the sample cell to the XPS analyzer was via an argon filled glove box. The silicon wafer was transferred to the XPS through an inert UHV transfer rod. This kept environmental exposure to a minimum.

Another wafer of silicon oxide, while exposed to argon gas as described above, was exposed to pulsed KrF excimer laser irradiation of 9 mJ/cm$^2$ for 6000 shots at a 10 Hz repetition rate. XPS analysis showed a surface carbon coverage of 40–45% both before and after laser treatment Thus, irradiation at 9 mJ/cm$^2$ did not remove adsorbed surface carbon.

Another wafer of silicon oxide, while exposed to argon gas as described above, was exposed to pulsed KrF excimer laser irradiation of 300 mJ/cm$^2$ for 6000 shots at a 10 Hz repetition rate. At the end of treatment, the substrate surface had suffered significant damage, including a hole through the substrate. Thus, irradiation at 300 mJ/cm$^2$ altered the molecular crystal structure of the substrate surface.

These examples show laser irradiation at an appropriate energy flux and wavelength can decrease surface contamination without damaging underlying surface or adjacent structures.

It is expected, in view of the heat of formation of SiO$_2$, that subjecting a silicon oxide substrate surface to pulsed KrF excimer laser irradiation of less than 100 mJ/cm$^2$ for 6000 shots at a 10 Hz repetition rate would not alter the molecular structure of the substrate. Pulsed KrF excimer laser irradiation of less than 75 mJ/cm$^2$ for 6000 shots at a 10 Hz repetition rate is not expected to alter a silicon oxide substrate surface in any way.

EXAMPLE II

High energy optical components are difficult to fabricate for such technologies as laser fusion, x-ray lithography and UV excimer laser optics Laser fusion and x-ray lithography technologies are used exclusively in "clean" environments. Excimer laser optics have a short work life span because with current commercial film deposition technology, it is difficult to fabricate films capable of withstanding prolonged high-energy fluxes.

A perennial problem with high energy optics is optical breakdown. This phenomena can be described as "the catastrophic evolution of damage inflicted in a transparent medium in a strong laser field." Y. R. Shen, *Principles of Nonlinear Optics*, 1st ed., 528–540 (Wiley Interscience 1984). This phenomena occurs in solids as well as gases. With a solid, such as a high energy optic, optical breakdown is exacerbated by the presence of a surface defect such as scratches and pores in the bulk material. In most cases, optical breakdown is due to surface contamination such as adsorbed dust particles The presence of these contaminants lowers the breakdown threshold which in turn limits the maximum laser power that can be used from a given laser system. This fact is a very important limitation regarding the pumping of a laser medium (solid state or gaseous) by an external pump energy source. This, in turn, limits the laser power that can be used to transmit energy through optical windows, lenses and other optical components.

Optical breakdown, for example on a solid, is promoted by the presence of surface adhered contaminants. The interaction of a laser pulse train with a sufficient energy cross section may deposit enough energy to generate an "avalanche" ionization on the solid surface. This can form a surface plasma which may disintegrate the solid. The presence of contaminants effectively decreases the laser's efficiency and decreases its use in potential applications.

To overcome the above described problems, the contaminant removal method, as described in this application, can be used to remove adhered contaminants such as absorbed dust. For example, to treat an optical component, the component is exposed to a continuous flow of argon gas during which time a pulse KrF excimer laser is directed at the surface of the optical component. The laser is tuned to an appropriate energy flux and wavelength that is considerably less than the high energy pulse required to promote ionization and subsequent plasma in high energy optics. The optical component surface is irradiated at the selected flux and wavelength for a duration sufficent to remove adsorbed contaminants.

It will be apparent to those skilled in the art that modifications and variations can be made in the method and apparatus of removing surface contaminants of this invention. The invention in its broader aspects is, therfore, not limited to the specific details, representative methods and apparatus, and illustrative examples shown and described above. Thus, it is intended that all matter contained in the foregoing description of shown in the accompanying drawings shall be interpreted as illustrative and not in a limiting sense.

What is claimed is

1. An apparatus for removing adsorbed surface contaminants from the surface of a substrate while preserving the substrate treatment surface, comprising:
   means for supplying a gas inert to the substrate treatment surface;
   gas flow means for constantly flowing said gas across the substrate treatment surface;
   laser pulse generating means for generating pulses of laser energy against the substrate treatment surface over which said gas constantly flows, said laser pulse generating means generating laser pulses having an energy density between the energy required to break bonds between adsorbed surface contaminants and the treatment surface, and the energy required to alter the molecular crystal structure of the substrate treatment surface.

2. The apparatus of claim 1 wherein said laser pulse generating means has an ultraviolet energy source.

3. The apparatus of claim 1 wherein said laser pulse generating means is a KrF excimer laser.

4. The apparatus of claim 1 wherein said gas flow means comprises:

an enclosure in which the substrate being treated can be placed, said enclosure having an inlet port and an outlet port, and means for introducing said continuous flow of gas to said enclosure through said inlet port.

5. The apparatus of claim 1 wherein said gas inert to the surface of said substrate is a chemically inert gas.

6. The apparatus of claim 5 wherein said chemically inert gas is argon.

7. The apparatus of claim 1 further comprising gas analyzer means for analyzing the gas constantly flowing across the substrate treatment surface during laser energy generation against said treatment surface, said gas analyzer means being for determining the composition of contaminants removed from said surface.

8. The apparatus of claim 4 further comprising gas analyzer means for analyzing the gas constantly flowing across the substrate treatment surface during laser energy generation against said treatment surface, said gas analyzer means being for determining the composition of contaminants removed from said surface, said gas analyzer means being connected to said enclosure outlet port.

9. The apparatus of claim 4 wherein said gas flow means further comprises:

a gas flow meter for monitoring the continuous flow of gas introduced to said enclosure through said inlet port.

10. The apparatus of claim 4 wherein said means for introducing said continuous flow of gas to said enclosure comprises means for introducing a constant flow of about 10 l/hr of said gas inert to the substrate treatment surface across said substrate placed in said enclosure.

* * * * *

UNITED STATES PATENT AND TRADEMARK OFFICE
CERTIFICATE OF CORRECTION

PATENT NO. : 5,099,557
DATED : March 31, 1992
INVENTOR(S) : Audrey C. Engelsberg It is certified that error appears in the above-indentified patent and that said Letters Patent is hereby corrected as shown below:

On the title page, in the abstract, line 5, --crystal-- should appear between molecular and structure;
In the Drawings, Fig. 3, "17" should be replaced with --19--;
In the drawings, Fig. 3, "17" should be replaced with --19--.
Column 4, line 21, "expensive" should be replaced with --expansive--;
Column 5, line 54, --crystal-- should appear between molecular and structure;
Column 5, line 29, "xeon" should be replaced with --xenon--;
Column 5, line 30, "infared" should be replaced with --infrared--;
Column 6, line 28, "17" should be replaced with --19--;
Column 6, line 56, --associated-- should appear between percentage and with;
Column 6, line 64, "103" should be replaced with --$10^3$--;
Column 7, line 46, "crystal" should appear between molecular and structure;
Column 7, line 66, "phenomena" should be replaced with --phenomenon--;
Column 8, line 24, "absorbed" should be replaced with --adsorbed--;
Column 10, line 15, "10" should be replaced with --16--.

Signed and Sealed this

Twenty-first Day of June, 1994

*Attest:*

BRUCE LEHMAN

*Attesting Officer*     *Commissioner of Patents and Trademarks*